US007981810B1

(12) United States Patent
Subramonium et al.

(10) Patent No.: US 7,981,810 B1
(45) Date of Patent: Jul. 19, 2011

(54) METHODS OF DEPOSITING HIGHLY SELECTIVE TRANSPARENT ASHABLE HARDMASK FILMS

(75) Inventors: Pramod Subramonium, Tigard, OR (US); Zhiyuan Fang, West Linn, OR (US); Jon Henri, West Linn, OR (US)

(73) Assignee: Novellus Systems, Inc., San Jose, CA (US)

( * ) Notice: Subject to any disclaimer, the term of this patent is extended or adjusted under 35 U.S.C. 154(b) by 88 days.

(21) Appl. No.: 11/449,983

(22) Filed: Jun. 8, 2006

(51) Int. Cl.
*H01L 21/31* (2006.01)
(52) U.S. Cl. ........ 438/778; 438/780; 438/738; 438/740; 257/E21.259; 257/E21.264; 216/49; 216/41
(58) Field of Classification Search .................. 438/738, 438/725, 740, 778, 780; 257/E21.259, E21.264; 216/49, 41
See application file for complete search history.

(56) References Cited

U.S. PATENT DOCUMENTS

| 4,209,357 | A | 6/1980 | Gorin et al. .................. 438/710 |
| 4,668,261 | A | 5/1987 | Chatzipetros et al. |
| 4,863,493 | A | 9/1989 | Kotani et al. ...................... 95/14 |
| 4,863,760 | A | 9/1989 | Schantz et al. ............. 427/163.2 |
| 5,231,057 | A | 7/1993 | Doki et al. .................... 438/637 |
| 5,261,250 | A | 11/1993 | Missimer |
| 5,378,316 | A | 1/1995 | Franke et al. |
| 5,470,661 | A | 11/1995 | Bailey et al. |
| 5,670,066 | A | 9/1997 | Barnes et al. ............ 219/121.58 |
| 6,030,591 | A | 2/2000 | Tom et al. |
| 6,035,803 | A * | 3/2000 | Robles et al. ............. 118/723 E |
| 6,041,734 | A | 3/2000 | Raoux et al. .............. 118/723 E |
| 6,066,209 | A | 5/2000 | Sajoto et al. |
| 6,150,719 | A | 11/2000 | Saia et al. ..................... 257/751 |
| 6,241,793 | B1 | 6/2001 | Lee et al. |
| 6,286,321 | B1 | 9/2001 | Glater |
| 6,319,299 | B1 | 11/2001 | Shih et al. |
| 6,331,480 | B1 | 12/2001 | Tsai et al. |
| 6,465,051 | B1 | 10/2002 | Sahin et al. ................... 427/534 |
| 6,478,924 | B1 | 11/2002 | Shamouilian et al. ... 156/345.48 |
| 6,541,397 | B1 | 4/2003 | Bencher |
| 6,573,030 | B1 | 6/2003 | Fairbairn et al. |
| 6,617,553 | B2 | 9/2003 | Ho et al. |
| 6,777,349 | B2 * | 8/2004 | Fu et al. ........................ 438/778 |
| 6,967,072 | B2 | 11/2005 | Latchford et al. |
| 7,223,526 | B2 | 5/2007 | Fairbairn et al. |
| 7,314,506 | B2 | 1/2008 | Vininski et al. |
| 7,323,401 | B2 | 1/2008 | Ramaswamy et al. ........ 438/551 |
| 7,381,644 | B1 | 6/2008 | Subramonium et al. |
| 7,820,556 | B2 | 10/2010 | Hsu et al. ..................... 438/758 |
| 2001/0021491 | A1 | 9/2001 | Chen et al. ..................... 430/523 |
| 2002/0182848 | A1 | 12/2002 | Joseph et al. |
| 2003/0044532 | A1 * | 3/2003 | Lee et al. ..................... 427/248.1 |
| 2004/0016972 | A1 * | 1/2004 | Singh et al. .................... 257/367 |
| 2004/0018750 | A1 | 1/2004 | Sophie et al. |
| 2004/0023502 | A1 | 2/2004 | Tzou et al. .................... 438/706 |
| 2004/0140506 | A1 * | 7/2004 | Singh et al. .................... 257/367 |
| 2004/0180551 | A1 | 9/2004 | Biles et al. |
| 2004/0224504 | A1 | 11/2004 | Gadgil .......................... 438/680 |
| 2004/0266195 | A1 * | 12/2004 | Dokumaci et al. ............ 438/698 |
| 2005/0042889 | A1 | 2/2005 | Lee et al. ....................... 438/780 |
| 2005/0098119 | A1 | 5/2005 | Burger et al. |
| 2005/0112506 | A1 * | 5/2005 | Czech et al. ................... 430/322 |
| 2006/0091559 | A1 | 5/2006 | Nguyen et al. |
| 2006/0154086 | A1 | 7/2006 | Fuller et al. .................... 428/428 |
| 2006/0197881 | A1 | 9/2006 | Kang et al. |
| 2006/0205223 | A1 | 9/2006 | Smayling ...................... 438/725 |
| 2007/0048674 | A1 | 3/2007 | Wells |
| 2007/0059913 | A1 * | 3/2007 | King et al. ..................... 438/597 |
| 2007/0125762 | A1 | 6/2007 | Cui et al. |
| 2007/0128538 | A1 | 6/2007 | Fairbairn et al. |
| 2007/0166546 | A1 | 7/2007 | Ichikawa et al. .............. 428/408 |
| 2007/0166979 | A1 | 7/2007 | Wang et al. |
| 2007/0247073 | A1 * | 10/2007 | Paterson et al. .......... 315/111.21 |
| 2008/0128907 | A1 | 6/2008 | Yang et al. ..................... 257/751 |
| 2008/0242912 | A1 | 10/2008 | Letessier et al. .............. 585/821 |
| 2008/0254641 | A1 | 10/2008 | Kobayashi et al. ........... 438/763 |
| 2009/0182180 | A1 | 7/2009 | Huang et al. .................... 585/16 |
| 2009/0305516 | A1 | 12/2009 | Hsu et al. ...................... 438/780 |
| 2010/0151691 | A1 | 6/2010 | Henri et al. .................... 438/758 |

FOREIGN PATENT DOCUMENTS

WO 2005/048367 5/2005

OTHER PUBLICATIONS

Subramonium et al., "Pulsed PECVD Method for Modulating Hydrogen Content in Hard Mask", U.S. Appl. No. 11/318,269, filed Dec. 23, 2005.
Ikeda et al., "Top-PECVD": A New Conformal Plasma Enhanced CVD Technology using TEOS, Ozone and Pulse-modulated RF Plasma,' 1992 IEEE, pp. 11.2.1-11.2.4.
U.S. Office Action mailed Dec. 14, 2006, from U.S. Appl. No. 11/318,269.
Subramonium et al., "Methods of Depositing Stable and Hermetic Ashable Hardmask Films," Novellus Systems, Inc., U.S. Appl. No. 11/710,377, filed Feb. 22, 2007, pp. 1-26.
Notice of Allowance and Fee Due mailed May 7, 2007 from U.S. Appl. No. 11/318,269.
Allowed Claims from U.S. Appl. No. 11/318,269.
Fang et al., "Methods of Improving Ashable Hardmask Adhesion to Metal layers," Novellus Systems, Inc., U.S. Appl. No. 11/612,382, filed Dec. 18, 2006.
U.S. Office Action mailed Oct. 9, 2007, from U.S. Appl. No. 11/612,382.
Grill, et al. "Diamondlike carbon films by rf plasma-assisted chemical vapor deposition from acetylene," IBM J. Res. Develop., vol. 34, No. 6, Nov. 1990, pp. 849-857.

(Continued)

*Primary Examiner* — Julio J Maldonado
(74) *Attorney, Agent, or Firm* — Weaver Austin Villeneuve & Sampson LLP

(57) ABSTRACT

The present invention addresses this need by providing a method for forming transparent PECVD deposited ashable hardmasks (AHMs) that have high plasma etch selectivity to underlying layers. Methods of the invention involve depositing the AHM using dilute hydrocarbon precursor gas flows and/or low process temperatures. The AHMs produced are transparent (having absorption coefficients of less than 0.1 in certain embodiments). The AHMs also have the property of high selectivity of the hard mask film to the underlying layers for successful integration of the film, and are suitable for use with 193 nm generation and below lithography schemes wherein high selectivity of the hard mask to the underlying layers is required. The lower temperature process also allows reduction of the overall thermal budget for a wafer.

19 Claims, 3 Drawing Sheets

OTHER PUBLICATIONS

Callegari et al., "Optical properties of hydrogenated amorphous-carbon film for attenuated phase-shift mask applications," J. Vac. Sci. Technol. B 11(6), Nov./Dec. 1993, pp. 2697-2699.

Grill, A., "Diamond-like carbon: state of the art," Diamond and Related Materials 8 (1999) 428-434.

Grill, A., "Plasma-deposited diamondlike carbon and related materials," IBM Journal of Research and Development, vol. 43, ½, 1999, http://research.ibm.com/journal/rd/431/grill.html. 14 pages.

Kragler et al., "Scanning tunneling microscopy based lithography employing amorphous hydrogenated carbon as a high resolution resist mask," Appl. Phys. Lett. 67 (8), Aug. 21, 1995, pp. 1163-1165.

Subramonium et al., "Pulsed PECVD Method for Modulating Hydrogen Content in Hard Mask," Novellus Systems, Inc., U.S. Appl. No. 12/048,967, filed Mar. 14, 2008.

Subramonium et al., "Methods and Apparatus for Plasma-Based Deposition," Novellus Systems, Inc., U.S. Appl. No. 11/849,208, filed Aug. 31, 2007.

U.S. Final Office Action mailed May 13, 2008, from U.S. Appl. No. 11/612,382.

U.S. Office Action mailed Aug. 19, 2008, from U.S. Appl. No. 11/612,382.

Subramonium et al., "Methods of Depositing Smooth and Conformal Ashable Hard Mask Films," Novellus Systems, Inc., U.S. Appl. No. 12/163,670, filed Jun. 27, 2008.

Hsu et al., "Method for Purifying Acetylene Gas for Use In Semiconductor Processes," Novellus Systems, Inc., U.S. Appl. No. 12/133,223, filed Jun. 4, 2008.

U.S. Office Action mailed Jan. 5, 2009, from U.S. Appl. No. 11/710,377.

Henri, et al., Method for Improved Thickness Repeatability of PECVD Deposited Carbon Films, Novellus Systems, Inc., U.S. Appl. No. 12/334,220, filed Dec. 12, 2008.

U.S. Office Action mailed May 12, 2009, from U.S. Appl. No. 11/612,382.

U.S. Appl. No. 11/710,377, Office Action mailed Aug. 19, 2009.

U.S. Appl. No. 12/133,223, Office Action mailed Aug. 19, 2009.

U.S. Appl. No. 11/612,382, Office Action mailed Dec. 9, 2009.

U.S. Appl. No. 12/133,223, Office Action mailed Dec. 21, 2009.

U.S. Appl. No. 12/133,223, Notice of Allowance mailed Mar. 2, 2010.

U.S. Appl. No. 11/710,377, Office Action mailed Mar. 31, 2010.

U.S. Appl. No. 11/612,382, Office Action mailed Mar. 26, 2010.

U.S. Appl. No. 12/766,721, "Methods For Forming Conductive Carbon Films by PECVD", Fox et al., filed Apr. 23, 2010.

U.S. Appl. No. 12/786,842, "Method for purifying acetylene gas for use in semiconductor processes", Hsu et al., filed May 25, 2010.

Korean Office Action mailed Jun. 1, 2010 for U.S. Appl. No. 2009-0048358.

U.S. Appl. No. 11/849,208, Office Action mailed Sep. 3, 2010.

* cited by examiner

METHODS OF DEPOSITING HIGHLY SELECTIVE TRANSPARENT ASHABLE HARDMASK FILMS

FIELD OF THE INVENTION

This invention relates to a novel method of producing ashable hard masks in semiconductor processing.

BACKGROUND OF THE INVENTION

Ashable hard masks (AHMs) are films used in semiconductor processing that may be removed by a technique referred to as "ashing." In particular, AHMs are often used as etch stop layers. 193 nm or lower lithography schemes require these AHMs to have high etch selectivity to underlying dielectric or metal barrier layers. In addition, 193 nm lithography schemes employ a 633 nm mask alignment laser—requiring the AHM to be transparent to light at 633 nm.

To date, know methods of producing highly selective AHMs rely on relatively high temperature (greater than 500 C) PECVD deposition processes. Many PECVD reactors are not designed to withstand such high processing temperatures, however. In addition, the extinction coefficient ("k value") of these films is typically higher than ideal for 193 nm lithography schemes.

Accordingly, it would be desirable to be able to produce transparent hard mask films having high etch selectivity. It would also be desirable to produce hard mask films having high etch selectivity at a relatively low deposition temperature (below 500° C., e.g., no more than 400° C.).

SUMMARY OF THE INVENTION

The present invention addresses this need by providing a method for forming transparent PECVD deposited ashable hardmasks (AHMs) that have high plasma etch selectivity to underlying layers. Methods of the invention involve depositing the AHM using dilute hydrocarbon precursor gas flows and/or low process temperatures. The AHMs produced are transparent (having absorption coefficients of less than about 0.1 in certain embodiments) and have high etch selectivities. The lower temperature process also allows reduction of the overall thermal budget for a wafer.

One aspect of the invention relates to a method of depositing an AHM involving providing a semiconductor device substrate in a deposition chamber, exposing the substrate to a process gas comprising a hydrocarbon precursor gas having a partial pressure between about 0.01 and 4 Torr and depositing on the substrate an ashable hard mask by a plasma enhanced chemical vapor deposition (PECVD) process at a process temperature between about 30 and 500 C, e.g., between about 30 and 300 C.

In particular embodiments, the partial pressure of the hydrocarbon precursor is between about 0.05 and 0.5 Torr, for example between about −0.05 and 0.1 Torr. Also in particular embodiments, the temperature may be between about 100 and 250 C. To maintain a low hydrocarbon partial pressure, a high flow carrier gas may be used to dilute the precursor gas. Examples of carrier gases include argon, nitrogen, helium and hydrogen. In a particular embodiment, hydrogen gas is used as the carrier gas. For example, between about 80-99% (by volume) of the process gas may be hydrogen. The overall pressure of the deposition chamber may be any suitable pressure. In some embodiments, the overall pressure may be less than about 2 Torr, for example 1.5 Torr.

The resulting hardmasks have low extinction coefficients, for example less than about 0.1. In some embodiments, the extinction coefficients are less than about 0.05. The hardmask are also highly selective, having selectivities of at least about 12:1, or at least about 15:1 according to various embodiments. Carbon content typically ranges between about 50-70%.

Also provided are methods of forming an ashable hard mask involving providing a semiconductor device substrate in a deposition chamber, exposing the substrate to a process gas comprising a hydrocarbon precursor gas having a partial pressure between about 0.01 and 0.05 Torr, and depositing on the substrate an ashable hard mask by a plasma enhanced chemical vapor deposition (PECVD) process.

In certain embodiments, the temperature may be low, for example less than 500 C, or in some embodiments, less than 400 C or 300 C. Other suitable temperature ranges are as described above.

Another aspect of the invention relates to methods of depositing an ashable hard mask involving providing a semiconductor device substrate in a deposition chamber, exposing the substrate to a process gas comprising a hydrocarbon precursor gas and depositing on the substrate an ashable hard mask by a plasma enhanced chemical vapor deposition (PECVD) process at process temperature between about 30 and 330 C. Suitable temperature and pressure ranges that may be used in accordance with this method are as described above.

In certain embodiments, the AHMs deposited by the methods of the invention are suitable for use as etch stops. In addition, the AHMs are suitable for use with 193 nm and below lithography schemes.

DETAILED DESCRIPTION OF THE INVENTION

Figure 1:
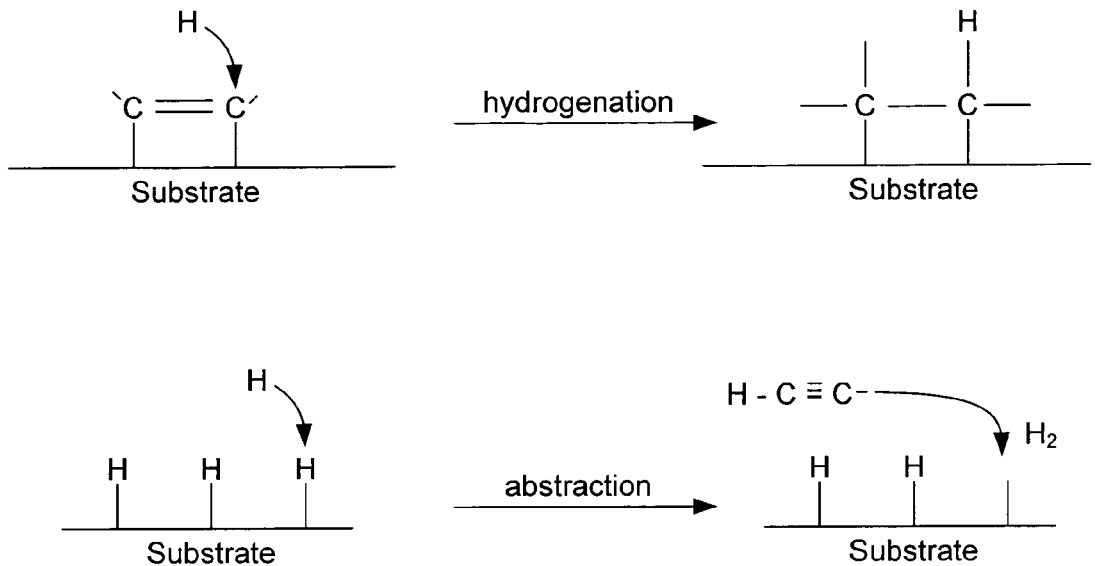
FIG. 1 depicts various proposed mechanisms of increasing density and sp3 bond content using the certain embodiments of the invention.

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Introduction

Hard masks are used as etch stop layers in semiconductor processing. Ashable hard masks (AHM) have a chemical composition that allows them to be removed by a technique referred to as ashing once they have served their purpose. An ashable hard mask is generally composed of carbon & hydrogen with trace amount of one or more dopants (e.g., nitrogen, fluorine, boron, silicon). The bonding structure in these hard masks can vary from sp2 (graphite-like) to sp3 (diamond-like) or a combination of both, depending on the deposition conditions. In a typical application, after etching the hard mask has served its purpose and must be removed from the underlying dielectric oxide (e.g., $SiO_2$). This is generally accomplished, at least in part, by ashing, also referred to as "plasma ashing" or "dry stripping." Substrates with hard masks to be ashed, generally partially fabricated semiconductor wafers, are placed into a chamber under vacuum, and oxygen is introduced and subjected to radio frequency power which creates oxygen radicals (plasma). The radicals react with the hard mask to oxidize it to water, carbon monoxide, and carbon dioxide. In some instances, complete removal of the hard mask may be accomplished by following the ashing with additional wet or dry etching processes, for example when the ashable hard mask leaves behind any residue that cannot be removed by ashing alone.

AHMs used as etch stop layers require have high etch selectivity so that the material being etched is removed faster than the AHM. In many applications, AHMs with etch selectivities of at least 15:1-20:1 (meaning the material being etched is removed 15-20 faster than the AHM during etching) are required. For example, 193 nm generation and below lithography schemes in particular require high selectivity of the hard mask to the underlying layers.

As indicated above, in many applications transparent AHMs are required. One measure of transparency is the extinction coefficient, k, a measure of the rate of extinction or diminution of electromagnetic radiation as it passes through the medium. For many applications, an extinction coefficient of around 0 indicates optical transparency and one around 1.3 indicates a very absorptive, almost opaque material. Extinction coefficients change according to the wavelength of the electromagnetic radiation. In many applications, AHMs having k values of at 0.1 or less at 633 nm are required. As transparency is inversely proportional to extinction coefficient times the film thickness, required extinction coefficient may depend on the film thickness. In a particular example, extinction coefficients at 633 nm of at or less than about 0.1 for a 5 kÅ AHM film are required.

To date, known methods for producing films having high etch selectivity (e.g., 15:1-20:1) rely on high temperature deposition processes. These processes produce highly graphitic and dense films having a carbon content around 80%. The dense and graphitic nature of the films drives down the etch rate of the AHM, increasing selectivity. However, because of the high sp2 content (sp2:sp3 ratio>2:1), these films do not have good transparency. For example, AHMs produced by high temperature deposition process have k-values of around 0.2-0.5 at 633 nm. Thus, they are not suited for use with mask alignment lasers at 633 nm.

Increasing the sp3 content makes the film diamond-like, increasing transparency. Lower temperature processes at typical PECVD operating conditions (e.g., temperature between about 300 and 400 C and relatively high precursor partial pressures around 5 Torr) may be used to produce films having carbon content around 60%. The resulting films have a significantly high sp3 fraction (typically for such films, NMR data show a sp2:sp3 ratio~1:1) and hence good transparency. However, these films are not dense and therefore have low etch selectivity.

The methods of the present invention produce films having good transparency and high etch selectivity. It has been found that by depositing AHMs at low process temperatures and/or low precursor partial pressure, AHMs having good transparency and high etch selectivity may be formed. For example, NMR data typically show a sp2:sp3 ratio<1:3 for films produced by these methods. Using relatively low temperatures results in transparent films. Lower temperatures prevent the film from graphitizing as well, resulting in films with high sp3 content (e.g., about 75%) and low extinction coefficients. Without being bound by a particular theory, it is believed that the using low partial precursor partial pressure results in increased density, thereby decreasing the etch rate and increasing the etch selectivity. Specifically, it is believed that low precursor partial pressure increases the number of non-depositing ions in the plasma relative to depositing radicals and that the resulting increased ion bombardment of the film facilitates compacting the film during its growth.

Low precursor partial pressure may be achieved by using a carrier gas having a high partial pressure. The carrier gas may be an inert gas such as helium, nitrogen, argon or a combination thereof. In some embodiments, hydrogen gas is used as the carrier gas. Using hydrogen as the carrier gas may further facilitate increasing the density of the film and creating high sp3 content by various reactive mechanisms. FIG. 1 shows several such possible mechanisms for surface reactions with a hydrocarbon precursor and hydrogen in a plasma. In the first mechanism, hydrogenation, carbon atoms from a hydrocarbon precursor are bound to the surface. The carbon atoms are bound to each other with a sp2 (double) bond. A hydrogen ion or radical bonds with one of the carbon atom, leaving a dangling bond on the other carbon and converting the sp2 (double) bond into sp3 (single) bonds. The second mechanism, abstraction, involves a hydrogen ion or radical abstracting a hydrogen atom bonded to the surface, forming hydrogen gas and leaving a dangling bond. As shown, the $CH_x$ precursor can then attach to the dangling bonds, reducing hydrogen content and increasing film density. In another abstraction mechanism not shown, a surface $CH_x$ is removed by a hydrogen ion or radical, forming a dangling bond. These mechanisms facilitate creating dense films that have high sp3 bond content.

The lower process temperatures used in embodiments of the present invention are compatible with existing semiconductor processing equipment, in particular PECVD reactors, such as Sequel™ or Vector™ reactor chambers available from Novellus Systems, Inc., San Jose, Calif. Thus, an ashable hard mask with the improved performance characteristics of increased selectivity and increased transparency, may be made without any hardware change.

PECVD Deposition Process

Figure 2:
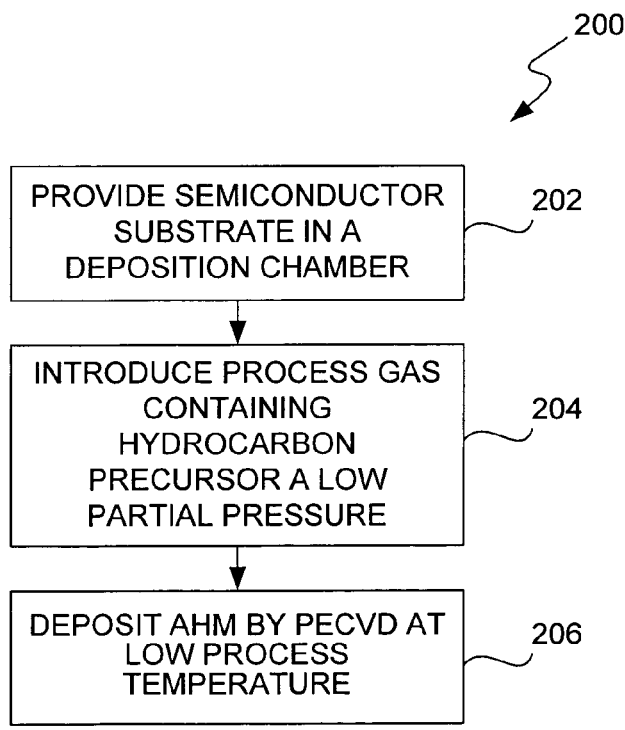
FIG. 2 depicts important stages in a general process flow for a method of forming an ashable hard mask in accordance with the present invention.

FIG. 2 depicts important stages in a general process flow for a method of forming an ashable hard mask in accordance with the present invention. The method (200) begins by providing a semiconductor device substrate in a deposition chamber (202). A process gas comprising a hydrocarbon precursor gas is introduced to the chamber at low partial pressure (204). Partial pressure of the precursor gas is between about 0.01-4 Torr. In certain embodiments the partial pressure is between about 0.01 and 0.1 Torr, and in a specific embodiment, between 0.05 and 0.1 Torr.

The hydrocarbon precursor may be, for example, one defined by the formula $C_XH_Y$, wherein X=2 to 10 and Y=2-24. Specific examples include methane, acetylene, ethylene, propylene, butane, cyclohexane, benzene and toluene and ($CH_4$, $C_2H_2$, $C_2H_4$, $C_3H_6$, $C_4H_{10}$, $C_6H_6$, $C_6H_{12}$ and $C_7H_8$, respectively). Acetylene is a preferred precursor in many applications.

As discussed above, a carrier gas may be used to dilute the precursor flow. The carrier gas may be any suitable carrier gas, including helium, argon, nitrogen, hydrogen, or a combination of any of these.

An ashable hard mask is deposited on the substrate by a PECVD process wherein the process (substrate) temperature is below 500 C (206). In some embodiments, the process temperature is below about 400 C, for example, between about 30 and 400 C. In some embodiments, the process temperature is below about 300 C, for example between about 30 and 300 C. In particular embodiments, the process temperature is between about 50 and 250 C, e.g, between 150 and 250 C.

Operation 206 is continued until the desired thickness of film is deposited. According to various embodiments, between about 1000 and 9000 angstroms is deposited.

Chamber pressure may be any suitable pressure. In conventional AHM deposition processes, pressure is typically 5-10 Torr. In particular embodiments of the present invention, the total chamber pressure may be lower than conventionally used. For example, it may range from 1-2 Torr. In embodiments wherein hydrogen is used as the carrier gas, hydrogen flow rate typically ranges from 1000-50000 sccm According to various embodiments, the methods of the present invention produce AHMs having etch selectivity of between about 15:1-20:1 relative to underlying dielectric and metal barrier layers. Also according to various embodiments, the highly selective AHMs are transparent at 633 nm. In certain embodiments, the AHMs have extinction coefficients less than or equal to about 0.1 at 633 nm. Acceptable k values may depend on AHM film thickness, with thicker films requiring lower extinction coefficients. In a particular embodiment, an AHM of 5000 angstroms having a k of no more than about 0.1 is deposited. In another embodiment, an AHM of 9000 angstroms having a k of no more than about 0.05 is deposited.

Apparatus

The present invention is preferably implemented in a plasma enhanced chemical vapor deposition (PECVD) reactor. Such a reactor may take many different forms. Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). In one embodiment, a wafer undergoing hard mask deposition is transferred from one station to another within a reactor chamber during the process. For example, for a 2000 Å hard mask film deposition, 500 Å of film may be deposited at each of four stations in accordance with the present invention. Of course, the full film deposition may occur entirely at a single station or any fraction of the total film thickness may be deposited at any number of stations.

While in process, each wafer is held in place by a pedestal, wafer chuck and/or other wafer holding apparatus. For certain operations in which the wafer is to be heated, the apparatus may include a heater such as a heating plate. In a preferred embodiment of the invention, a Vector™ (e.g., C23 Vector) or Sequel™ (e.g., C2 Sequel) reactor, produced by Novellus Systems of San Jose, Calif., may be used to implement the invention.

Figure 3:
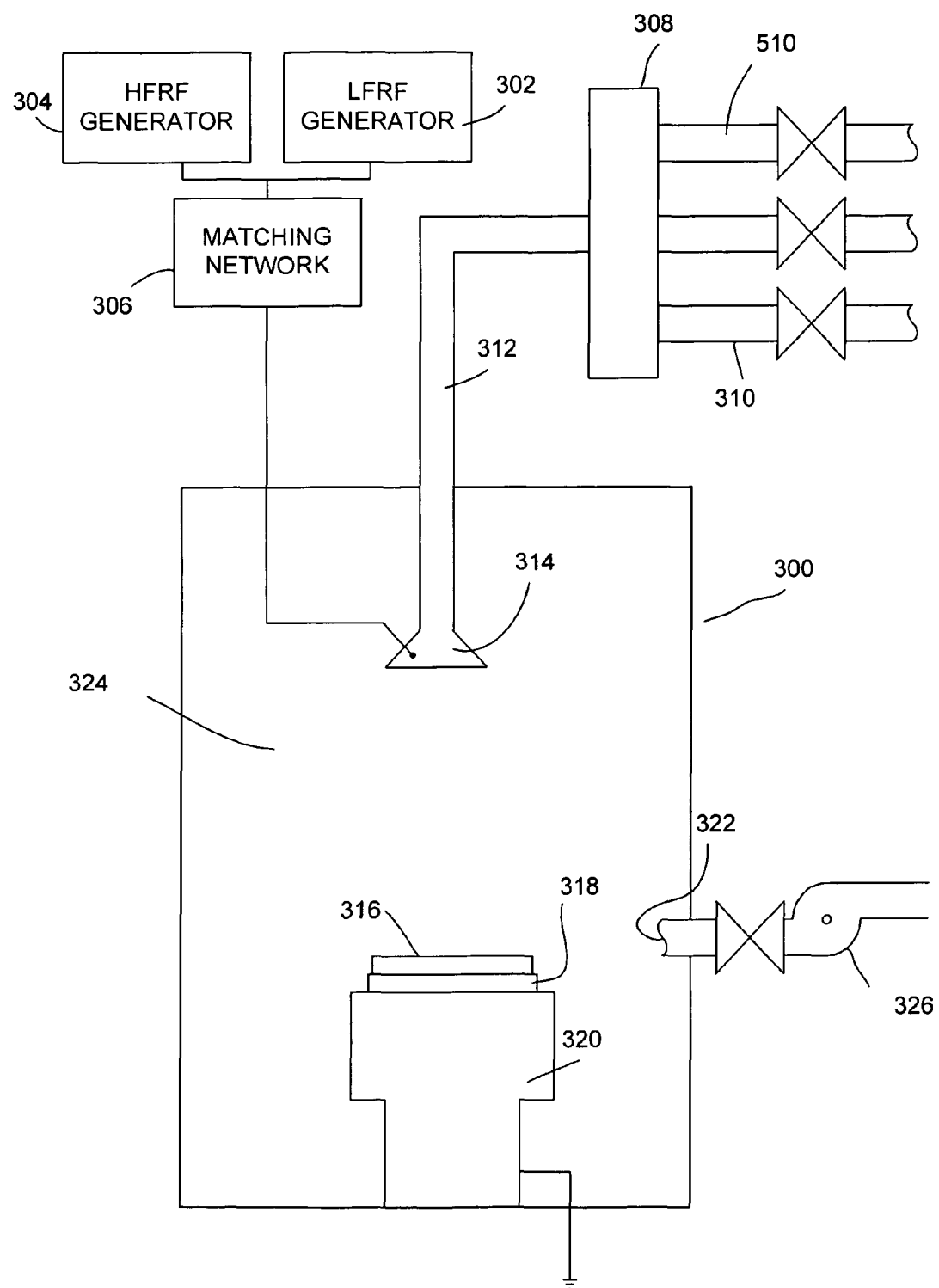
FIG. 3 is a simple block diagram depicting a PECVD reactor arranged for implementing the present invention.

FIG. 3 provides a simple block diagram depicting various reactor components arranged for implementing the present invention. As shown, a reactor 300 includes a process chamber 324, which encloses other components of the reactor and serves to contain the plasma generated by a capacitor type system including a showerhead 314 working in conjunction with a grounded heater block 320. A high-frequency RF generator 302, connected to a matching network 306, and a low-frequency RF generator 304 are connected to showerhead 314. The power and frequency supplied by matching network 306 is sufficient to generate a plasma from the process gas, for example 400-700 W total energy. In a typical process, the high frequency RF component is generally between 2-60 MHz; in a preferred embodiment, the HF component is 13.56 MHz. The LF componenet can be from 100 kHz-2 MHz; in a preferred embodiment, the LF component is 400 kHz Within the reactor, a wafer pedestal 318 supports a substrate 316. The pedestal typically includes a chuck, a fork, or lift pins to hold and transfer the substrate during and between the deposition and/or plasma treatment reactions. The chuck may be an electrostatic chuck, a mechanical chuck or various other types of chuck as are available for use in the industry and/or research.

The process gases are introduced via inlet 312. Multiple source gas lines 310 are connected to manifold 308. The gases may be premixed or not. Appropriate valving and mass flow control mechanisms are employed to ensure that the correct gases are delivered during the deposition and plasma treatment phases of the process. In case the chemical precursor(s) is delivered in the liquid form, liquid flow control mechanisms are employed. The liquid is then vaporized and mixed with other process gases during its transportation in a manifold heated above its vaporization point before reaching the deposition chamber.

Process gases exit chamber 300 via an outlet 322. A vacuum pump 326 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

The invention may be implemented on a multi-station or single station tool. In specific embodiments, the 300 mm Novellus Vector™ tool having a 4-station deposition scheme or the 200 mm Sequel™ tool having a 6-station deposition scheme are used. It is possible to index the wafers after every deposition and/or post-deposition plasma anneal treatment until all the required depositions and treatments are completed, or multiple depositions and treatments can be conducted at a single station before indexing the wafer. It has been shown that film stress is the same in either case. However, conducting multiple depositions/treatments on one station is substantially faster than indexing following each deposition and/or treatment.

Examples

The following examples are provided to further illustrate aspects and advantages of the present invention. These examples are provided to exemplify and more clearly illustrate aspects of the present invention and are in no way intended to be limiting.

Figure 4:
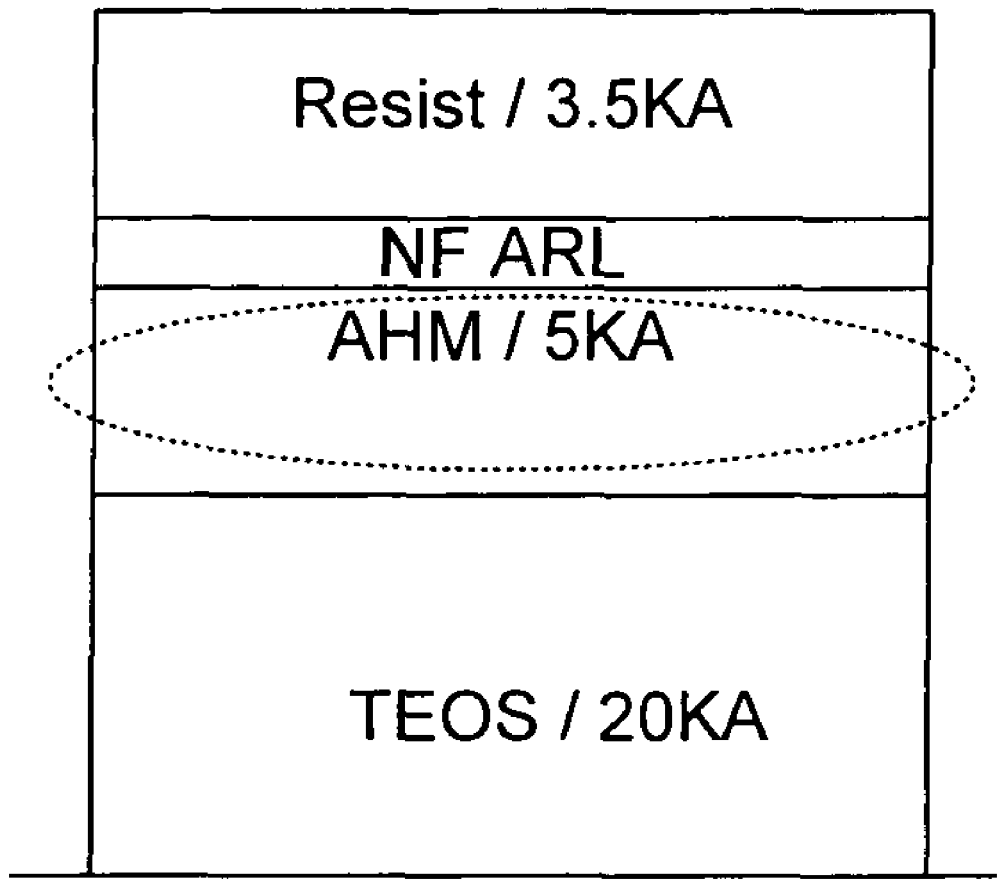
FIG. 4 shows a rough schematic of a dielectric/AHM/ARL/photoresist film stack that may be used in accordance with the present invention.

FIG. 4 shows a rough schematic of a dielectric/AHM/ARL/ photoresist film stack. In the stack shown in FIG. 4, a 5000 angstrom AHM overlies a 20,000 angstrom layer of dielectric material (TEOS) on a silicon substrate. A nitrogen free anti-reflective layer (NF ARL) is overlies over the AHM and photoresist overlies the NF ARL. The stack shown in FIG. 4 is just an example of a stack in which an AHM may be employed. In an example application, the portion of the dielectric to be etched is unprotected by the AHM (not shown). The photoresist is patterned and an etch process performed to define the desired features down to the AHM (etch stop) and to etch the unprotected dielectric to define the features in the dielectric. The AHM is then ashed as discussed above.

Film stacks as shown in FIG. 4 using various AHMs were formed. An ARL/AHM open etch was performed, and then a main oxide etch. An oxygen dominated etch chemistry was used for the ARL/AHM open etch and a $C_4F_6/C_4F_8/O_2/Ar$ chemistry was used for the oxide etch. The following AHMs were formed, and etch selectivity and extinction coefficient was measured for each as shown in Table 1:

TABLE 1

Selectivity and Extinction Coefficient of Various AHMs

| | Temp (° C.) | $C_2H_2$ flow (sccm) | $H_2$ flow (sccm) | He flow (sccm) | $N_2$ flow (sccm) | Pressure (Torr) | $C_2H_2$ Partial Pressure (Torr) | Feature Top Selectivity | k @ 633 nm |
|---|---|---|---|---|---|---|---|---|---|
| 1 | 150 | 750 | 13500 | 0 | 0 | 1.5 | 0.08 | 17.5 | 0.06 |
| 2 | 150 | 1250 | 13500 | 0 | 0 | 1.5 | 0.12 | 13.5 | 0.04 |
| 3 | 150 | 2000 | 7500 | 0 | 0 | 1.5 | 0.32 | 12 | 0.02 |
| 4 | 400 | 6750 | 0 | 13500 | 1500 | 8 | 2.48 | 11 | 0.03 |
| 5 | 550 | 2500 | 0 | 12000 | 1000 | 6 | 0.97 | 15 | 0.39 |

Feature top selectivity is one of the several different ways of measuring AHM etch selectivity. Feature top selectivity is calculated as $$\frac{\text{Oxide Thickness}_{Etched}}{(AHM\ \text{Thickness}_{Deposited} - AHM\ \text{Thickness}_{after\ Etch(at\ the\ top\ of\ the\ feature)})}$$

Other process conditions for AHMs 1-3 include the HFRF and LFRF power and frequency. HFRF power was 200 W and HFRF frequency was 13.56 MHz for the above processes. LFRF power was 2400 W and LFRF frequency was 400 kHz for the above processes. AHMs 4-5 used HF=400 W & LF=1200 W.

AHMs 1-3 were produced according to certain embodiments of the present invention, i.e., at low temperature and low $C_2H_2$ partial pressure. All of these AHMs have selectivity of at least 12:1 and k of less than 0.1. AHM #4, produced at 400 C and 8 Torr (2.5 Torr $C_2H_2$ partial pressure) also has good transparency, though lower selectivity than the AHMs produced at lower pressure. AHM #5, produced by a high temperature process, had a high selectivity, 15:1, but is not transparent, with an extinction coefficient of almost 0.4.

As can be seen from comparing AHMs 1-3 in Table 1, selectivity improves as the partial pressure is decreased, with the highest selectivity/low temperature AHM formed using a $C_2H_2$ partial pressure of 0.08. It is believed this is a result of lower partial pressure causing increased densification of the film. As can be seen from comparing AHMs 1-3 to AHM #5, lower temperature results in better transparency. It is believed that this is because lower temperature prevents the film from graphitizing; the films are thus dominated by sp3 bonds and have good transparency.

AHMs A-G were also produced at various process conditions, with composition, transparency and density as shown in Table 2. AHM A was produced at 400 C, with HFRF power. AHMs B, C and D were produced at 550 C, with process conditions for B the same as for AHM #5 in Table 1. A nitrogen-free process for AHM C was used, with C2H2/H2/He flowrates of 2000/3500/13500 sccm, HFRF/LFRF powers of 200/1200 W, and a pressure of 4 Torr. The process conditions for D the same as for AHM #5 except using high LFRF. AHMs E, F and G were produced as for AHMs #1-3 in Table 1, at low temperature (150 C) with low $C_2H_2$ partial pressure, $H_2$ flows of 7500-13500 sccm, and a total pressure of 1.5 Torr. Process conditions for AHMS A-G are summarized below:

A: 400 C, C2H2/H2 flow of 2000/9000 sccm, HFRF/LFRF=2000/400 W, pressure of 6 Torr
B: 550 C, conditions as for #5, Table 1
C: 550 C, C2H2/H2/He flows of 2000/3500/13500 sccm, HFRF/LFRF powers of 200/1200 W and pressure of 4 Torr
D: 550 C, High LFRF of 2400 W (600 W per station). All other conditions same as AHM #5, Table 1
E: conditions as for #1, Table 1
F: conditions as for #2, Table 1
G: conditions as for #3, Table 1
Composition, density, stress and transparency were determined for each of the AHMs and are shown in Table 2.

TABLE 2

Composition, density and transparency of various AHMs

| | A | B | C | D | E | F | G |
|---|---|---|---|---|---|---|---|
| Composition (H:C:N) | 43:56:00 | 20:79:0.2 | 14:86:00 | 21:77:00 | 41:59:00 | 43:53:00 | 46:54:00 |
| Density (g/cc) | 1.03 | 1.45 | 1.54 | 1.26 | 1.29 | 1.16 | 1.14 |
| Stress (E9 dynes/cm$^2$) | 0.4 | 0.2 | 0.6 | 0.4 | −5 | −3.9 | −3.9 |
| Transparency (k at 633 nm) | 0.06 | 0.39 | 0.46 | 0.38 | 0.06 | 0.04 | 0.02 |

AHMs E-G in Table 2 were produced according to certain embodiments of the present invention, i.e., at low temperature and low precursor partial pressure. Carbon content is between about 50-60% for these films, similar to the carbon content of AHM A, which was produced at 400 C. However, the density is superior to AHM A. Note that the transparency of all high temperature processes is unacceptably high for mask alignment lasers.

CONCLUSION

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. Accordingly, the present embodiments are to be considered as illustrative and not restrictive, and the invention is not to be limited to the details given herein.

All references cited herein are incorporated by reference for all purposes.

What is claimed is:

1. A method of forming an ashable hard mask, comprising:
providing a semiconductor device substrate in a deposition chamber;
exposing the substrate to a process gas comprising a hydrocarbon precursor gas having a partial pressure between about 0.01 and 0.5 Torr;
depositing on the substrate an ashable hard mask by a capacitively coupled plasma enhanced chemical vapor deposition (PECVD) process at a process temperature between about 30° C. and 300° C., wherein a power of the low frequency (LF) component of the capacitively coupled plasma is at least 1200 W.

2. The method of claim 1, wherein the partial pressure of the hydrocarbon precursor is between about 0.05 and 0.5 Torr.

3. The method of claim 1, wherein the partial pressure of the hydrocarbon precursor is between about 0.05 and 0.1 Torr.

4. The method of claim 1 wherein the process temperature is between about 100° C. and 250° C.

5. The method of claim 1 wherein the process gas further comprises hydrogen gas.

6. The method of claim 5 wherein the partial pressure of the hydrogen gas is between about 1.0-1.5 Torr and the partial pressure of the hydrocarbon precursor is between about 0.05-0.5 Torr.

7. The method of claim 1 wherein the resulting hard mask has an extinction coefficient (k) of less than about 0.1.

8. The method of claim 1 wherein the resulting hard mask has a carbon content between about 50-70%.

9. The method of claim 1 wherein the resulting hard mask has an etch selectivity of between about 12:1 and 20:1 compared to an underlying dielectric material.

10. The method of claim 1 wherein the resulting hard mask has an etch selectivity of between about 15:1 and 20:1 compared to an underlying dielectric material.

11. The method of claim 1 further comprising depositing a photoresist material over the ashable hard mask.

12. The method of claim 1 wherein the partial pressure of the hydrocarbon precursor is less about 0.5 and the total pressure in the deposition chamber is less than about 2 Torr.

13. The method of claim 1 wherein the total chamber pressure is at least 1 Torr during the deposition.

14. A method of forming an ashable hard mask, comprising:
providing a semiconductor device substrate in a deposition chamber;
exposing the substrate to a process gas comprising a hydrocarbon precursor gas having a partial pressure between about 0.01 and 0.05 Torr, wherein the process temperature is less than about 400° C.;
depositing on the substrate an ashable hard mask by a capacitively coupled plasma enhanced chemical vapor deposition (PECVD) process, wherein a power of a low frequency (LF) component of the capacitively coupled plasma is at least 1200 W.

15. The method of claim 14, wherein the process temperature is less than about 300° C.

16. The method of claim 14 wherein the process gas is between about 80-90% hydrogen by volume.

17. The method of claim 14 wherein the total pressure in the deposition chamber is below about 2 Torr.

18. The method of claim 14 wherein total chamber pressure is greater than about 1 Torr wherein the total chamber pressure is at least 1 Torr during the deposition.

19. A method of forming an ashable hard mask, comprising:
providing a semiconductor device substrate in a deposition chamber;
exposing the substrate to a process gas comprising a hydrocarbon precursor gas having a partial pressure between about 0.01 and 0.5 Torr; and
depositing on the substrate an ashable hard mask by a capacitively coupled plasma enhanced chemical vapor deposition (PECVD) process at a process temperature between about 30° C. and 400° C., wherein a power of a low frequency (LF) component of the capacitively coupled plasma is at least 1200 W.

* * * * *